United States Patent
Wu

(10) Patent No.: US 7,482,866 B2
(45) Date of Patent: Jan. 27, 2009

(54) AUDIO SYSTEM WITH POWER-ON/OFF NOISE SUPPRESSION AND AUDIO AMPLIFIER THEREOF

(75) Inventor: Kuo-Hung Wu, Tainan County (TW)

(73) Assignee: Himax Analogic, Inc., Tainan County (TW)

( * ) Notice: Subject to any disclaimer, the term of this patent is extended or adjusted under 35 U.S.C. 154(b) by 85 days.

(21) Appl. No.: 11/671,471

(22) Filed: Feb. 6, 2007

(65) Prior Publication Data

US 2008/0186090 A1    Aug. 7, 2008

(51) Int. Cl.
*H03F 1/14* (2006.01)
(52) U.S. Cl. .......................... 330/51; 330/297
(58) Field of Classification Search .................... 330/51, 330/98, 150, 297, 310
See application file for complete search history.

(56) References Cited

U.S. PATENT DOCUMENTS

| 4,983,927 | A  | * | 1/1991 | Torazzina ..................... 330/51 |
| 5,760,652 | A  | * | 6/1998 | Maemura et al. ............. 330/297 |
| 6,356,745 | B1 | * | 3/2002 | Lee et al. .................. 455/232.1 |
| 6,788,151 | B2 | * | 9/2004 | Shvarts et al. ............... 330/297 |
| 7,196,583 | B2 | * | 3/2007 | Clifton et al. ............... 330/285 |

\* cited by examiner

*Primary Examiner*—Henry K Choe
(74) *Attorney, Agent, or Firm*—Jianq Chyun IP Office

(57) ABSTRACT

An audio system with power-on/off noise suppression and an audio amplifier thereof are disclosed. The audio system includes a front stage circuit and an audio amplifier. The front stage circuit is powered by a first supply voltage and outputs an audio signal. The audio amplifier amplifies the audio signal to drive a load. When a level of the first supply voltage drops below a threshold, the audio amplifier is disabled.

11 Claims, 4 Drawing Sheets ns a block diagram illustrating a conventional audio stage circuit.
AUDIO SYSTEM WITH POWER-ON/OFF NOISE SUPPRESSION AND AUDIO AMPLIFIER THEREOF

BACKGROUND OF THE INVENTION

1. Field of the Invention

The present invention relates to an amplifier, and more particularly to an audio system with power-on/off noise suppression and an audio amplifier thereof.

2. Description of Related Art

Power-on/off noises emitted by speakers on normal electronic products often annoy users. On close examination, the audio stage of the electronic products is found to be affected by a time difference resulting from power ramp down as the power is on or off, which leading to the power-on/off noises.

FIG. 1 is a block diagram illustrating a conventional audio stage circuit. In the conventional audio stage, an amplifier 120 amplifies audio signals to drive a speaker 130. The audio signals are outputted by front stage circuits 110 such as CODEC, and so on. In general, a supply voltage PVDD required by the amplifier 120 exceeds a supply voltage AVDD required by the front stage circuit 110. FIG. 2 illustrates a timing sequence relationship between a first supply voltage AVDD and a second supply voltage PVDD. Please refer to FIGS. 1 and 2 together. As the first supply voltage AVDD is increased by more than 3V, the front stage circuit 110 starts operating normally. Here, the front stage circuit 110 outputs normal audio signals. As the first supply voltage AVDD drops below 2.4V, the front stage circuit 110 is shutdown and outputs the abnormal audio signals (power-on/off noises).

When the second supply voltage PVDD exceeds 8.5V, the amplifier 120 starts amplifying the audio signals outputted by the front stage circuit 110 to drive the speaker 130. As the second supply voltage PVDD drops below 8V, the amplifier 120 is shutdown. However, since the front stage circuit 110 is shutdown before the amplifier 120 is, the power-on/off noises outputted by the front stage circuit 110 are amplified and outputted to the speaker 130. The power-on/off noises often annoy the users.

SUMMARY OF THE INVENTION

The present invention provides an audio system and an audio amplifier thereof, which determines if the audio amplifier is disabled according to the condition of a first supply voltage of a front stage circuit and further suppresses the power-on/off noises.

To resolve said issue, the present invention provides an audio system including the front stage circuit and the audio amplifier. The front stage circuit is powered by the first supply voltage and outputs an audio signal. The audio amplifier amplifies the audio signal to drive a load. Here, when a level of the first supply voltage drops below a threshold, the audio amplifier is disabled.

The present invention provides an audio amplifier which is adopted to amplify an audio signal outputted from a front stage circuit to drive a load. The front stage circuit is powered by a first supply voltage, while the audio amplifier is powered by a second supply voltage. The audio amplifier includes an input pin and a disabling circuit. The input pin is used to receive a detection signal indicating a condition of the first supply voltage. When the detection signal indicates a level of the first supply voltage drops below a threshold, the disabling circuit decouples the second supply voltage from the audio amplifier.

The present invention determines if the audio amplifier is disabled according to the condition of the first supply voltage of the first stage circuit. In other words, as the level of the first supply voltage drops below the operational scope of the first stage circuit, the audio amplifier is disabled to a proper extent so as not to amplify the abnormal signals outputted by the first stage circuit. Thereby, the power-on/off noises can be suppressed.

In order to make the aforementioned and other objects, features and advantages of the present invention understandable, several embodiments accompanied with figures are described in detail below.

DESCRIPTION OF EMBODIMENTS

Figure 3:
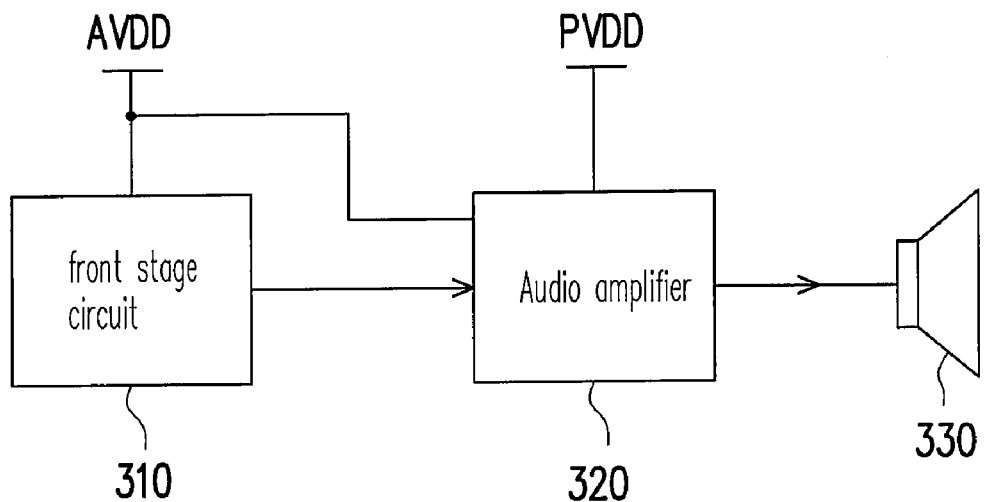
FIG. 3 is a block diagram illustrating an audio system capable of suppressing power-on/off noises according to an embodiment of the present invention.

FIG. 3 is a block diagram illustrating an audio system capable of suppressing power-on/off noises according to an embodiment of the present invention. The audio system includes a front stage circuit 310, an audio amplifier 320, and a load e.g. a speaker 330. The front stage circuit 310 may include an audio decoder, a coder, and/or a micro control unit. The front stage circuit 310 is powered by a first supply voltage AVDD and outputs an audio signal. The audio amplifier 320 receives and amplifies the audio signal to drive the speaker 330. In the present embodiment, the audio amplifier 320 is powered by a second supply voltage PVDD, and the first supply voltage AVDD is less than the second supply voltage PVDD.

The audio amplifier 320 receives a detection signal through an input pin. The detection signal is utilized to indicate a condition of the first supply voltage AVDD. In the present embodiment, the audio amplifier 320 directly receives the first supply voltage AVDD as the detection signal through the input pin. When a level of the first supply voltage drops below a certain threshold, the audio amplifier 320 is disabled. The threshold can be determined based on requirements of the system. For example, the threshold is set to the lowest level of the first supply voltage AVDD for the front stage circuit 310 to operate normally. Or the threshold is set as a certain percentage e.g. 75% of the level of the first supply voltage AVDD during a steady state.

Figure 4:
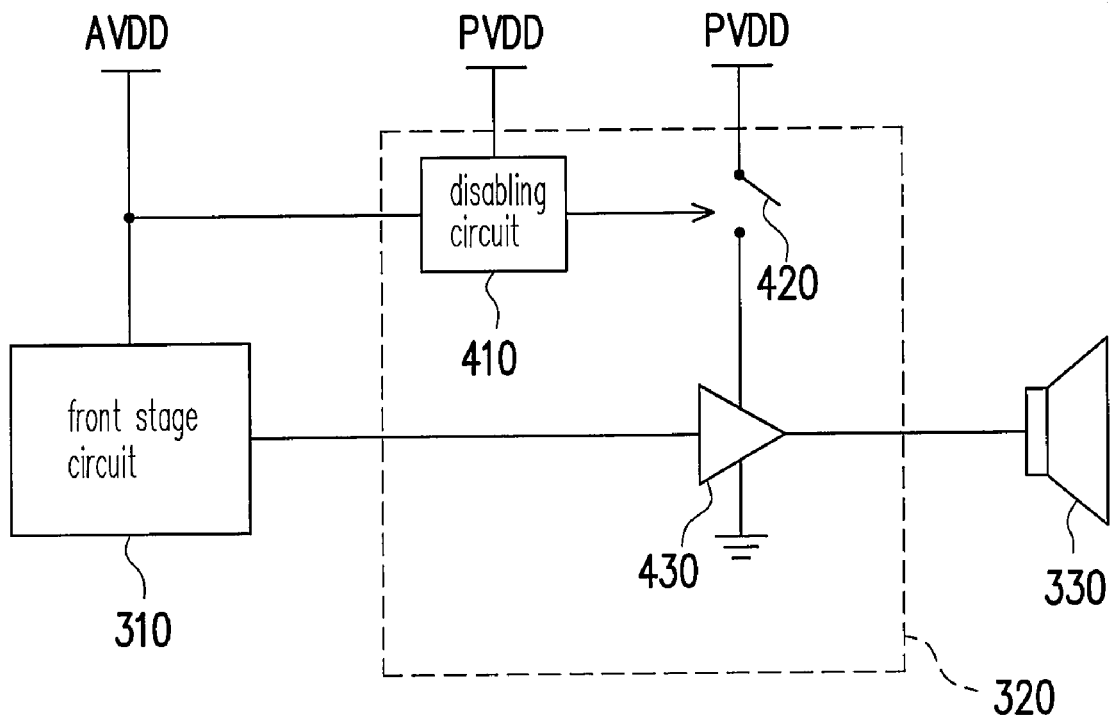
FIG. 4 shows an embodiment of an audio amplifier in FIG. 3 according to the present invention.

FIG. 4 shows an embodiment of the audio amplifier 320 in FIG. 3 according to the present invention. Please refer to FIG. 4. The audio amplifier 320 may include an input pin, a disabling circuit 410, a switch 420, and an amplifying circuit 430. The disabling circuit 410 receives a detection signal i.e. a first supply voltage AVDD hereinafter through the input pin. Based on the detection signal, the disabling circuit 410 controls the switch 420 and determines if a second supply voltage PVDD is coupled to the amplifying circuit 430. The amplifying circuit 430 powered by the second supply voltage PVDD amplifies an audio signal outputted by the front stage circuit 310 and outputs the amplified audio signal to the speaker 330. Hence, when the detection signal indicates a level of the first supply voltage AVDD drops below a threshold, the disabling circuit 410 decouples the second supply voltage PVDD from the audio amplifier 320.

Figure 1:
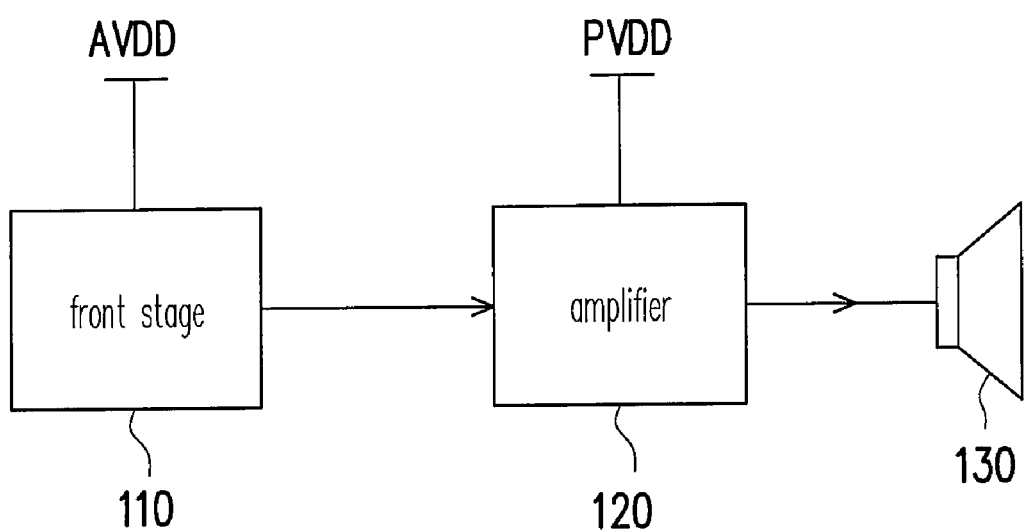
FIG. 1 is a block diagram illustrating a conventional audio stage circuit.
Figure 2:
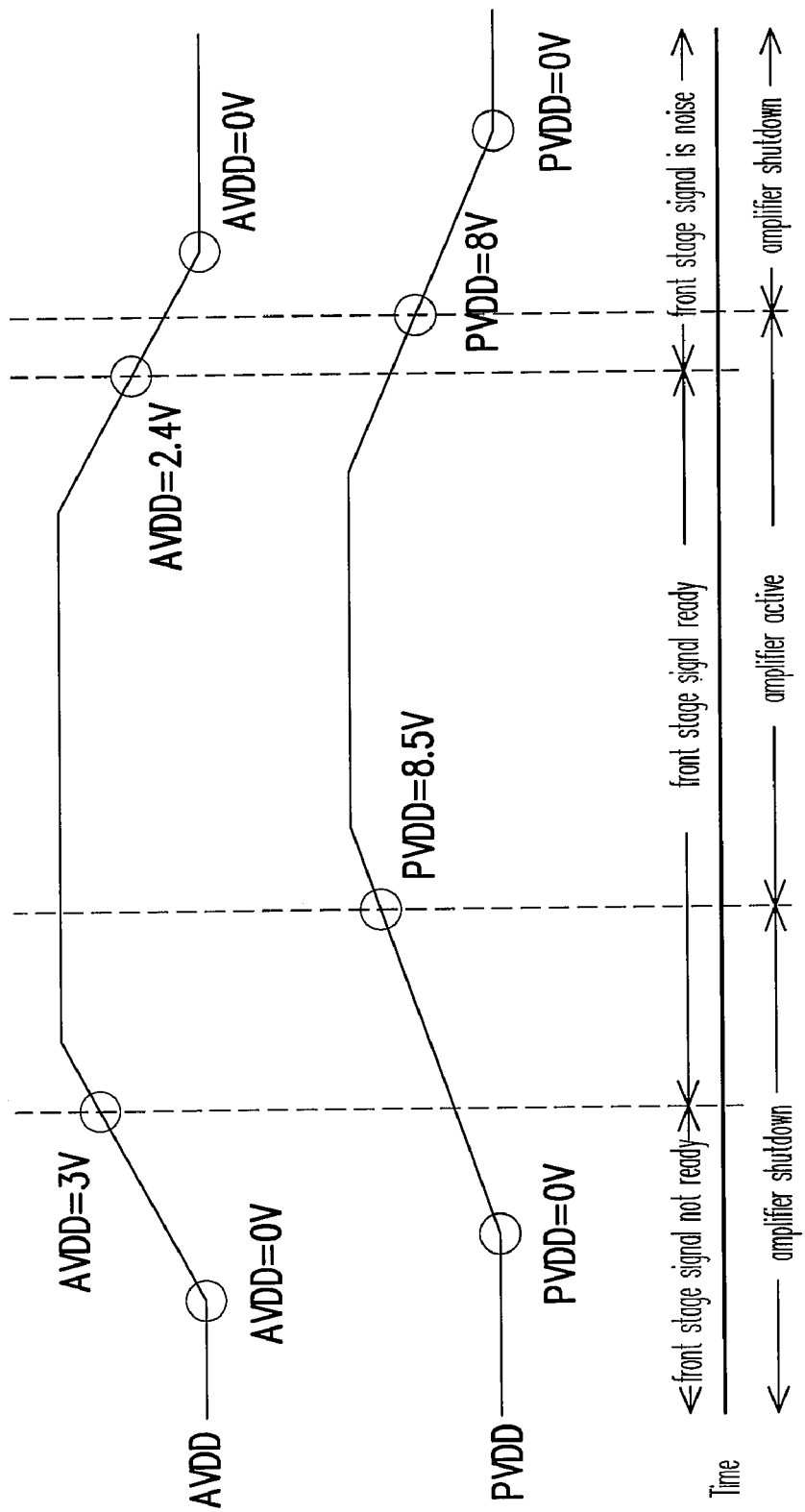
FIG. 2 illustrates a timing sequence relationship between a first supply voltage AVDD and a second supply voltage PVDD.

Here, the operational process of the present embodiment is illustrated in FIG. 2. Although the following description of the power-on/off noise suppression is provided hereinafter in conjunction with FIG. 2, those skilled in the art should know that the present invention can be applied to any power-on/off noise suppression according to the spirit of the present invention and the teachings or suggestion of the embodiments described below. Namely, if the first supply voltage AVDD achieves an active level at a slower pace than the second supply voltage PVDD, the audio amplifier 320 can be disabled until the first supply voltage AVDD arrives at the active level.

Please refer to FIGS. 2 and 4 together. The active level of the first supply voltage AVDD (the lowest level required by the front stage circuit 310 to operate normally) is predetermined to be approximately 2.4V. When the first supply voltage AVDD is lower than 2.4V, the first stage circuit 110 outputs the abnormal audio signals (power-on/off noises), for the first supply voltage AVDD is excessively low. However, when the first supply voltage AVDD is lower than 2.4V, the second supply voltage PVDD may still be above the active level (the lowest level required by the front stage circuit 320 to operate normally, 8V approximately) Thus, the disabling circuit 410 controls the switch 420 based on the first supply voltage AVDD to determine if the second supply voltage PVDD is coupled to the amplifying circuit 430. When the level of the first supply voltage AVDD drops below the threshold (2.4V in the present embodiment), the disabling circuit 410 decouples the second supply voltage PVDD from the audio amplifier 320 (or the amplifying circuit 430). Thereby, the audio amplifier of the present embodiment can be disabled to a proper extent so as not to amplify the abnormal signals outputted by the first stage circuit, and accordingly the power-on/off noises can be suppressed.

Figure 5:
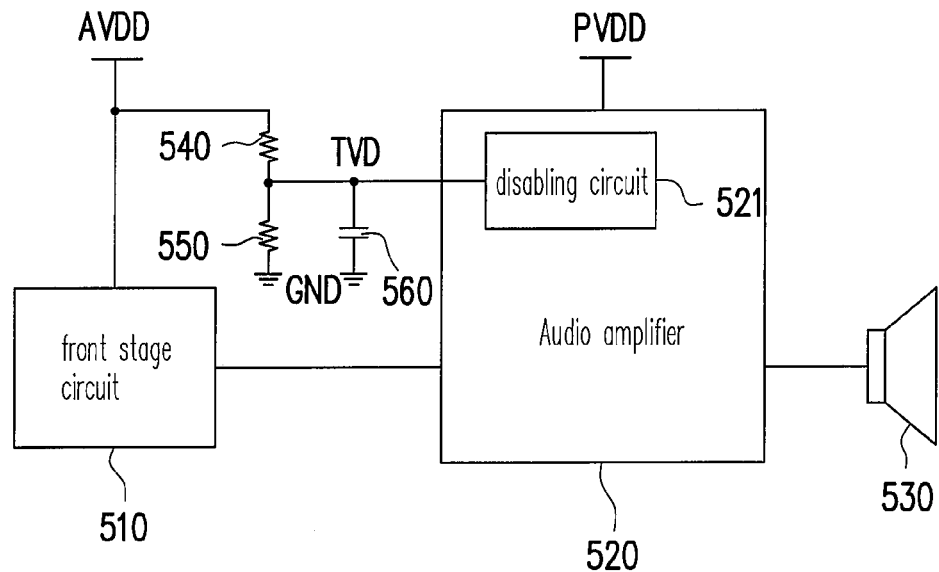
FIG. 5 shows another embodiment of the audio system with the power-on/off noise suppression according to the present invention.

FIG. 5 shows another embodiment of the audio system with the power-on/off noise suppression according to the present invention. Please refer to FIG. 5. The audio system includes a front stage circuit 510, an audio amplifier 520, a load e.g. a speaker 530, a first resistor 540, a second resistor 550, and a capacitor 560. The front stage circuit 510 may include an audio decoder, a coder, and/or a micro control unit. The front stage circuit 510 is powered by a first supply voltage AVDD and outputs an audio signal. The audio amplifier 520 receives and amplifies the audio signal to drive the speaker 530. In the present embodiment, the audio amplifier 520 having a disabling circuit 521 is powered by a second supply voltage PVDD. The first and the second resistors 540 and 550 are connected in series between the first supply voltage AVDD and a ground voltage GND. A first terminal of the capacitor 560 is coupled to a second terminal of the first resistor 540, and a second terminal of the capacitor 560 is connected to ground.

The first supply voltage AVDD is divided by the first and the second resistors 540 and 550 to generate a detection signal TVD. The detection signal TVD $=(R_{550}*AVDD)/(R_{540}+R_{550})$. Here, $R_{540}$ and $R_{550}$ respectively represent the values of the first and the second resistors 540 and 550. Thereby, the detection signal TVD is capable of indicating the condition of the first supply voltage AVDD. The ratio between the first and the second resistors 540 and 550 can be determined desirably based on the requirements of the system. When a level of the first supply voltage AVDD drops below a threshold, the detection signal TVD drops below a predetermined level corresponding to the threshold.

The threshold and the predetermined level corresponding to the threshold can be determined based on the requirements of the system. For example, the threshold is set to the lowest level of the first supply voltage AVDD for the front stage circuit 510 to operate normally. Or the threshold is set as a certain percentage e.g. 75% of the level of the first supply voltage AVDD during a steady state. In the present embodiment, the predetermined level corresponding to the threshold can be set to a triggering level of the disabling circuit 521. The equation TVD=$(R_{550}*AVDD)/(R_{540}+R_{550})$ can be applied to adjust the values of the first and the second resistors 540 and 550 based on the threshold and the triggering level of the disabling circuit 521.

Thereby, the disabling circuit 521 of the audio amplifier 520 can determine if the detection signal TVD is below the predetermined level through an input pin. Given that the detection signal TVD is below the predetermined level, the audio amplifier 520 is then disabled. For example, the second supply voltage PVDD is decoupled from the audio amplifier 520.

Figure 6:
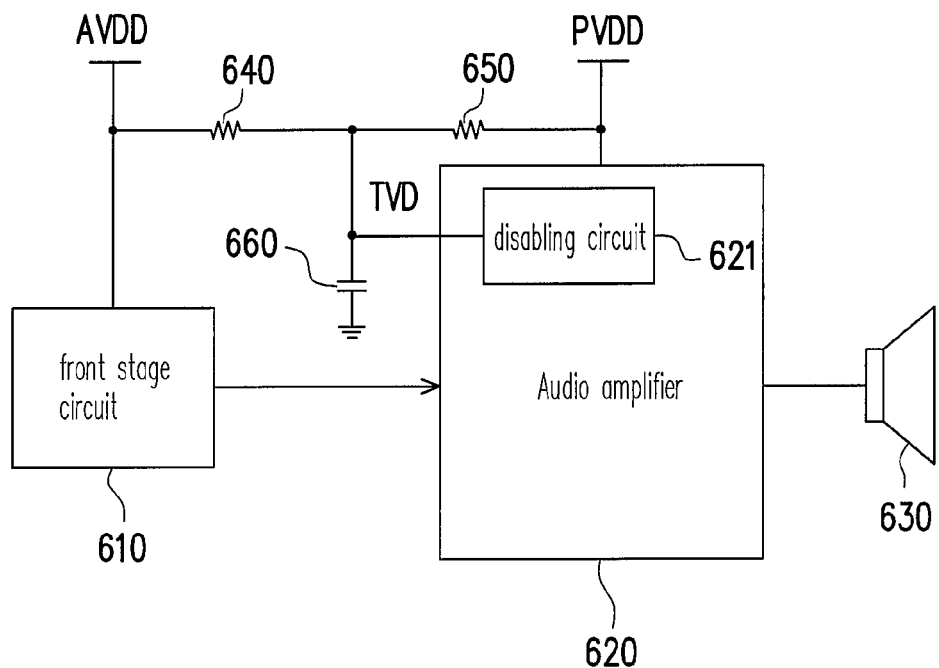
FIG. 6 shows still another embodiment of the audio system with the power-on/off noise suppression according to the present invention.

FIG. 6 shows still another embodiment of the audio system with the power-on/off noise suppression according to the present invention. Please refer to FIG. 6. The audio system includes a front stage circuit 610, an audio amplifier 620, a load e.g. a speaker 630, a first resistor 640, a second resistor 650, and a capacitor 660. The front stage circuit 610 may include an audio decoder, a coder, and/or a micro control unit. The front stage circuit 610 is powered by the first supply voltage AVDD and outputs an audio signal. The audio amplifier 620 receives and amplifies the audio signal to drive the speaker 630. In the present embodiment, the audio amplifier 621 having a disabling circuit 620 is powered by a second supply voltage PVDD. The first and the second resistors 640 and 650 are connected in series between the first supply voltage AVDD and a second supply voltage PVDD. A first terminal of the capacitor 660 is coupled to a second terminal of the first resistor 640, and a second terminal of the capacitor 660 is connected to ground.

A detection signal TVD is generated at the second terminal of the first resistor 640. The detection signal TVD= $(R_{640}*AVDD)/(R_{640}+R_{650})+(R_{650}*PVDD)/(R_{640}+R_{650})$. Here, $R_{640}$ and $R_{650}$ respectively represent the values of the first and the second resistors 640 and 650. Thereby, the detection signal TVD is capable of indicating the condition of the first supply voltage AVDD. The ratio between the first and the second resistors 640 and 650 can be determined desirably based on the requirements of the system. When a level of the first supply voltage AVDD drops below a threshold, the detection signal TVD drops below a predetermined level corresponding to the threshold.

The threshold and the predetermined level corresponding to the threshold can be determined based on the requirements of the system. For example, the threshold is set to the lowest level of the first supply voltage AVDD for the front stage circuit 610 to operate normally. Or the threshold is set as a certain percentage e.g. 75% of the level of the first supply voltage AVDD during a steady state. In the present embodiment, the predetermined level corresponding to the threshold can be set to a triggering level of the disabling circuit 621. The equation TVD=$(R_{640}*AVDD)/(R_{640}+R_{650})+(R_{650}*PVDD)/(R_{640}+R_{650})$ can be applied to adjust the values of the first and the second resistors 640 and 650 based on the predetermined threshold and the triggering level of the disabling circuit 621.

Thereby, the disabling circuit 621 of the audio amplifier 620 can determine if the detection signal TVD is below the predetermined level through an input pin. Given that the detection signal TVD is below the predetermined level, the audio amplifier 620 is disabled by way of decoupling the second supply voltage PVDD from the audio amplifier 620, for example.

In summary, the audio amplifier can be determined to be disabled or not according to the condition of the supply voltage of the front stage circuit in said embodiments. In other words, as the level of the supply voltage drops below the operational scope of the first stage circuit, the audio amplifier is disabled to a proper extent so as not to amplify the abnormal signals outputted by the first stage circuit. Thereby, the power-on/off noises can be suppressed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An audio system comprising:
    a front stage circuit powered by a first supply voltage and outputting an audio signal; and
    an audio amplifier, powered by a second supply voltage different from the first supply voltage, and amplifying the audio signal to drive a load;
    wherein the front stage circuit operates normally only when the first supply voltage is above a threshold and the audio amplifier is disabled when a level of the first supply voltage drops below the threshold.

2. The audio system as claimed in claim 1, wherein the threshold is 75% of the level of the first supply voltage during a steady state.

3. The audio system as claimed in claim 1 further comprising:
    a first resistor having a first end coupled to receive the first supply voltage; and
    a second resistor having one end coupled to a second end of the first resistor and the other end coupled to receive a ground voltage;
    wherein the audio amplifier is disabled when a level of the voltage on the second end of the first resistor is lower than a predetermined level corresponding to the threshold.

4. The audio system as claimed in claim 3 further comprising a capacitor having one end coupled to the second end of the first resistor and the other end coupled to receive the ground voltage.

5. The audio system as claimed in claim 1 further comprising:
    a first resistor having a first end coupled to receive the first supply voltage; and
    a second resistor having one end coupled to a second end of the first resistor and the other end coupled to receive the second supply voltage;
    wherein the audio amplifier is disabled when a level of the voltage on the second end of the first resistor is lower than a predetermined level corresponding to the threshold.

6. The audio system as claimed in claim 5 further comprising a capacitor having one end coupled to the second end of the first resistor and the other end coupled to receive a ground voltage.

7. The audio system as claimed in claim 1, wherein the first supply voltage is less than the second supply voltage.

8. The audio system as claimed in claim 1, wherein the load comprises a speaker.

9. The audio system as claimed in claim 1, wherein the front stage circuit comprises an audio decoder, coder or a micro control unit.

10. An audio amplifier powered by a second supply voltage and amplifying an audio signal from a front stage circuit to drive a load, wherein the front stage circuit is powered by a first supply voltage and operates normally only when the first supply voltage is above a threshold, the audio amplifier comprising:
    an input pin receiving a detection signal indicating a condition of the first supply voltage; and
    a disabling circuit decoupling the second supply voltage from the audio amplifier when the detection signal indicates a level of the first supply voltage lower than the threshold.

11. The audio amplifier as claimed in claim 10, wherein the threshold is 75% of the level of the first supply voltage during a steady state.

* * * * *